United States Patent [19]

Murphy et al.

[11] 4,140,558
[45] Feb. 20, 1979

[54] ISOLATION OF INTEGRATED CIRCUITS UTILIZING SELECTIVE ETCHING AND DIFFUSION

[75] Inventors: Bernard T. Murphy, Summit; James C. North, New Providence, both of N.J.

[73] Assignee: Bell Telephone Laboratories, Incorporated, Murray Hill, N.J.

[21] Appl. No.: 882,802

[22] Filed: Mar. 2, 1978

[51] Int. Cl.² .................... H01L 21/76; H01L 21/306
[52] U.S. Cl. .................................. 148/175; 29/576 E; 29/576 W; 29/578; 29/580; 148/187; 156/648; 156/652; 156/653; 156/662; 357/49; 357/50; 357/55; 357/60
[58] Field of Search ............................. 148/175, 187; 156/647–649, 652, 653, 657, 662; 29/576 E, 576 W, 578, 580; 357/49, 50, 55, 60

[56] References Cited

U.S. PATENT DOCUMENTS

| 3,210,620 | 10/1965 | Lin | 357/55 X |
| 3,500,139 | 3/1970 | Frouin et al. | 148/175 X |
| 3,611,058 | 10/1971 | Jordan | 357/55 X |
| 3,648,125 | 3/1972 | Peltzer | 357/50 |
| 3,677,280 | 7/1972 | Weckler | 148/175 X |
| 3,753,803 | 8/1973 | Nomura et al. | 148/175 |
| 3,760,239 | 9/1973 | Hruby et al. | 357/49 |
| 3,847,687 | 11/1974 | Davidsohn | 148/187 |
| 3,966,577 | 6/1976 | Hochberg | 357/50 X |
| 3,969,746 | 7/1976 | Kendall et al. | 148/175 X |
| 4,042,726 | 8/1977 | Kaji et al. | 156/648 X |

OTHER PUBLICATIONS

Gaylon, G. T., "Isolation of Device Components," I.B.M. Tech. Discl. Bull., vol. 18, No. 6, Nov. 1975, pp. 1854–1855.

Primary Examiner—L. DeWayne Rutledge
Assistant Examiner—W. G. Saba
Attorney, Agent, or Firm—Lester H. Birnbaum

[57] ABSTRACT

Disclosed is a method of isolating portions of integrated circuits which permits closely packed structures. A semiconductor wafer is provided with a substrate of one conductivity type, a first layer of opposite conductivity type and high impurity concentration formed thereon, and a second layer of either conductivity type but lower concentration formed over the first layer. The major surfaces of the semiconductor layers are parallel to the (110) plane. Narrow grooves with sidewalls in the (111) plane are etched into the first layer. A shallow diffusion of impurities of the same conductivity type as the first layer is performed in the sidewalls and bottom of the grooves which permits the first layer to be contacted from the surface of the second layer. The groove is then etched further until it extends into the underlying substrate. Impurities of the same conductivity type as the substrate are diffused into the bottom and sidewalls of the grooves. The concentration of these impurities is chosen so that a chanstop region is formed in the substrate without appreciably affecting electrical conductivity between the first layer and the regions formed by the previous diffusion.

9 Claims, 7 Drawing Figures

ISOLATION OF INTEGRATED CIRCUITS UTILIZING SELECTIVE ETCHING AND DIFFUSION

BACKGROUND OF THE INVENTION

This invention relates to the fabrication of semiconductor integrated circuits, and in particular to a method of forming electrically isolated areas in the semiconductor material.

In the fabrication of bipolar integrated circuits, the semiconductor wafer is typically a three tier structure, with a p-type substrate, an $n^+$ region serving as a low resistance contact or collector region which is formed either as an isolated region or an epitaxial layer over the entire surface of the substrate, and an n-type or p-type epitaxial layer formed over the $n^+$ region, which n-type epitaxial layer serves as the active region of the devices and the p-type layer serves as the bases of transistors. An important, and often troublesome, step in the fabrication of circuits is the electrical isolation of portions of these epitaxial layers.

One method currently being used involves diffusing opposite conductivity type impurities through the epitaxial layer or layers to form an isolating region extending to the p-type substrate in the case of the n-type epitaxial layer or to the $n^+$ type collector in the case of the p-type epitaxial layer and surrounding the desired isolated area (see, for example, U.S. Pat. No. 3,648,125, issued to Peltzer). Another basic approach is to etch channels to the p substrate around the area to be isolated and then fill the channels with oxide (see, for example, U.S. Pat. No. 4,056,415, issued to Cook). The major drawback of both these methods is that the isolating regions take up a large area of the semiconductor and do not permit closely packed structures. Further, the junction isolation technique adds sidewall capacitance to the circuit, while the oxide-filled channel approach is usually restricted to shallow structures and often requires long oxidation which can cause undesired stresses.

In the prior art methods, the buried low resistance contact is usually formed in selective areas of the substrate and contact is made thereto from the surface by diffused regions. Such a technique requires additional masking and diffusion operations if a low resistance contact is required, and also contributes further to the problem of utilizing too much semiconductor area, since the diffusions from the surface have to be deep enough to penetrate the top layer and the resulting width of the diffused regions is quite large. It would be more desirable to form the buried contact or collector by means of a layer covering the entire surface of the substrate, thereby eliminating a masking operation, and to make contact to such a layer from the surface of the wafer with a shallow diffusion.

It is also advantageous to provide $p^+$ regions as a means of preventing inversion of portions of the p substrate which are exposed by etching channels, and incorporating formation of such means with the remainder of the processing in a manner which will conserve space and limit the number of masking operations. Such regions are often referred to as "chanstop" regions.

The invention is therefore directed to the problem of providing a method for isolating portions of a three layer semiconductor wafer which permits contact to a buried layer and formation of chanstop regions while utilizing a minimum of semiconductor area and therefore permitting closely packed structures.

SUMMARY OF THE INVENTION

The problem is solved in accordance with the invention. Isolated regions are formed in a semiconductor wafer with major surfaces lying in the (110) plane, which wafer includes a substrate of a first conductivity type, a first layer of opposite conductivity type formed thereon and a second layer of the first or opposite conductivity type but lower concentration than the first layer formed over the first layer. The method includes etching grooves in the surface of the second layer with sidewalls in the (111) plane and extending into the first layer. A region of the same conductivity type as the first layer and higher concentration than the second layer is formed in the sidewalls and bottom of the grooves. The grooves are etched further to extend into the substrate, and a region of the same conductivity type as the substrate but higher impurity concentration is formed in the bottom and the portions of the sidewalls of the grooves which extend into the substrate. The grooves can then be filled by a thermal oxidation.

Utilization of this particular orientation permits formation of very narrow grooves. In addition, since contact is made to the buried layer by a diffusion through the sides of the grooves rather than from the surface, a shallow diffusion is possible.

BRIEF DESCRIPTION OF THE DRAWING

These and other features of the invention are delineated in detail in the following description. In the drawing.

It will be realized that for purposes of illustration these figures are not drawn to scale.

DETAILED DESCRIPTION

Figure 1:
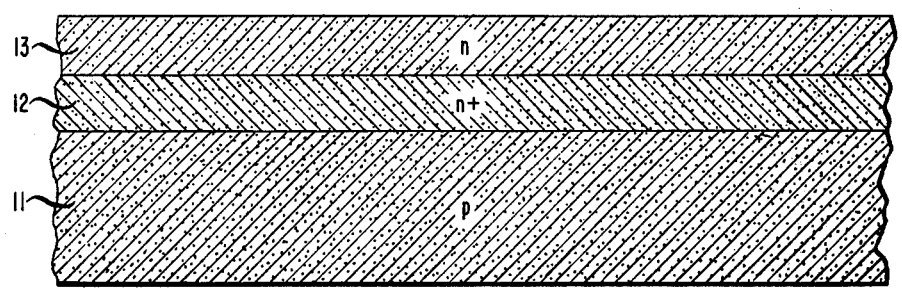
FIGS. 1-6 are cross-sectional views of a portion of a semiconductor wafer during various stages in the fabrication of an integrated circuit in accordance with one embodiment of the invention.

FIG. 1 illustrates a portion of a semiconductor wafer, 10, in which an integrated circuit is to be fabricated. This wafer structure is known in the art. It includes a p-type substrate, 11, which is typically approximately 20 mils thick and doped with boron to give an impurity concentration of approximately $5 \times 10^{15}$ per $cm^3$.

In accordance with one aspect of the invention, the major surface of the substrate is parallel to the (110) crystallographic plane. A first epitaxial layer, 12, of $n^+$ conductivity type is formed on the substrate with a thickness in the range 1-10 microns. This layer is typically doped with arsenic to give an impurity concentration of approximately $10^{18}$ per $cm^3$ or higher. A second epitaxial layer, 13, of n conductivity type is formed over the first layer. This layer is also 1-10 microns thick and is doped with phosphorous, but with an impurity concentration in the range $10^{16}$–$10^{17}$ per $cm^3$. These layers also have their major surface parallel to the (110) plane.

The invention is most advantageously employed with layer thicknesses of at least 3 microns. The invention may also be employed with high voltage devices requiring layer thicknesses of greater than 10 microns.

The $n^+$ layer and n layer may be formed by discrete epitaxial processes or may be formed in the same epitaxial chamber by varying the impurity and the impurity concentration in accordance with known techniques. It may also be possible to form the structure of FIG. 1 by other means. For example, an $n^+$ layer may be formed in the substrate by ion implantation and then the n layer formed thereover. The precise means of fabricating the wafer structure is not significant for the purposes of the invention.

The $n^+$ layer, 12, serves as a low resistance contact and the n-type layer is used to construct the active region of the devices to be fabricated. It is therefore necessary to divide the two layers into electrically isolated regions and also make contact to each of the individual $n^+$ regions from the surface of the wafer.

Figure 2:
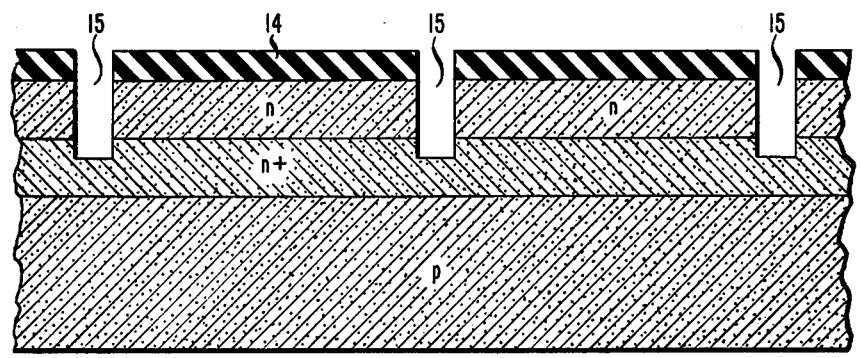

An etch resistant mask, 14, of FIG. 2, is then formed on the surface of the n layer 13. This mask may be formed by growing or depositing a layer of silicon dioxide silicon nitride, boron nitride or other appropriate material on the surface, covering with a layer of photoresist (not shown), exposing the areas to be removed to light, developing the resist, and wet or dry etching the exposed regions of oxide, followed by stripping the resist. Such procedures are well known in the art.

Figure 7:
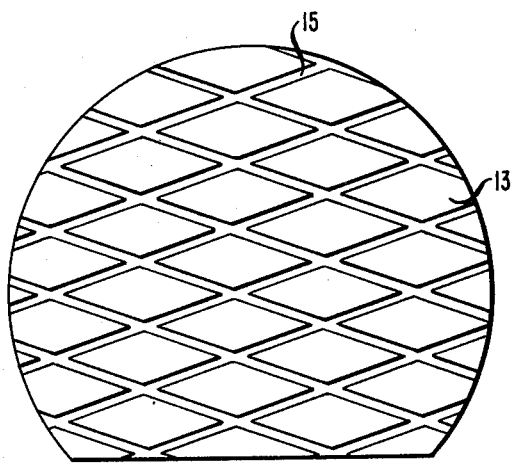
FIG. 7 is a top view of the semiconductor wafer in one stage of fabrication in accordance with the same embodiment.

Next, as shown in FIG. 2, narrow grooves, 15, are etched through the n layer 13 and extending into the $n^+$ layer 12 using layer 14 as a mask. In accordance with one feature of the invention, the grooves are etched so that the sidewalls are in the (111) plane. As shown in the plan view of FIG. 7, this requires forming each isolated region in the shape of a parallelogram with corner angles of approximately 110 degrees and 70 degrees. The advantage of such an orientation is that extremely narrow grooves can be formed due to the anisotropic nature of the etching thereby conserving semiconductor space. Typically, the grooves are etched with a width of approximately 2-4 microns utilizing standard photolithographic techniques described above. However, with electron beam exposure techniques, it may be possible to achieve grooves as narrow as 1 micron.

The grooves may be etched with a solution of KOH at a temperature of approximately 70 degrees C. A useful temperature range is 65-90 degrees C. Utilizing a 44 percent KOH solution at 70 degrees C., for example, a vertical etching rate of approximately 1 micron per minute results with negligible lateral etching. Etching should continue until the groove extends at least past the boundary of the n and $n^+$ layers. The location of the bottom of the groove is not critical, and may even extend into the substrate 11.

Figure 3:
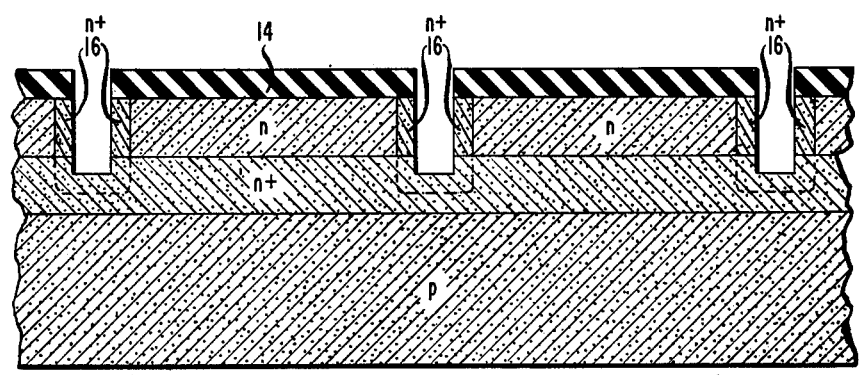

Next, as shown in FIG. 3, regions, 16, of $n^+$ conductivity type are formed into the sidewalls of the grooves. This is accomplished, for example, by diffusion of P or As impurities from a gas source of $POCl_3$ or $AsH_3$. Typically, the diffusion is performed at a temperature of 1,000-1,050 degrees C. for approximately 20 minutes to 1 hour. Preferably, the depth of diffusion is 4 microns or less. The purpose of the region 16 is to provide a low resistance contact to the $n^+$ layer 12 from the surface of layer 13. Usually, the impurity concentration of region 16 will initially be within the range $10^{19}-10^{21}$ per $cm^3$. Most advantageously, the sheet resistivity will be approximately 10 ohms/square.

It will be appreciated that impurities are diffused into the entire sidewall surface as well as the bottom of the grooves, which therefore produces $n^{++}$ portions in the area of the grooves residing in $n^+$ layer 12. These portions of the regions are shown in phantom in FIG. 3 since they do not have any significant effect on the operation of the circuit.

It will be realized that one of the advantages of the present method is the fact that the contact region 16 can be formed by a shallow diffusion. That is, since the impurities are diffused through the sides of the grooves rather than through the layer 13 from the top surface, the total area taken up by these regions is minimized.

Figure 4:
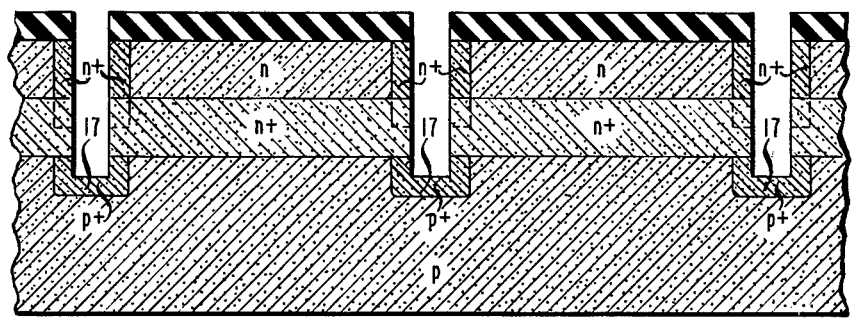

In the next step, as illustrated in FIG. 4, the grooves, 15, are etched further until they extend into the p-type substrate 11. This can be done by again applying a KOH solution at a temperature of 65-90 degrees C. until the desired depth is reached. The precise depth is not critical as long as the bottom of the groove extends past the junction between the substrate and the first layer sufficiently far to give the desired isolation between adjacent isolated regions. The anisotropic nature of the etching in this crystal orientation results in no significant lateral etching and therefore allows deeper etching to be effected without destroying the previously formed $n^+$ region 16.

Regions, 17, of $p^+$ conductivity type are then formed in the bottom and portions of the sides of the grooves which lie in the substrate. This may be done, for example, by subjecting the structure to a vapor of boron tribromide at a temperature of approximately 1,000 degrees C. in order to diffuse boron impurities into the sides and bottoms of the grooves. The impurity concentration of these regions is less than that of regions 16 so that the latter are not significantly affected. In this example, the depth of diffusion for regions 17 is less than that of region 16 but this is not critical. The impurity concentration of regions 17 should be chosen so that the net donor concentration of region 16 is sufficient to provide good contact. On the other hand, the impurity concentration of regions 17 should be at least $10^{16}$ per $cm^3$ in order to prevent inversion of the substrate in these areas. A preferred acceptor concentration range for regions 17 appears to be approximately $10^{16}-10^{18}$ per $cm^3$. Typically, the impurity concentrations of regions 16 and 17 are chosen to give a sheet resistance of 10-100 ohms per square for region 16 in the final device.

It will be clear to the skilled artisan that the doping of the substrate, 11, may be initially chosen so as to eliminate the need for $p^+$ chanstop regions 17, although at a cost of inferior performance. In such cases, the initial etching step and diffusion of $n^+$ regions 16, followed by further etching into the substrate as described above would still be followed in order to contact $n^+$ layer 12 without shorting adjacent devices through the $n^+$ regions 16 at the bottom of the groove.

Figure 5:
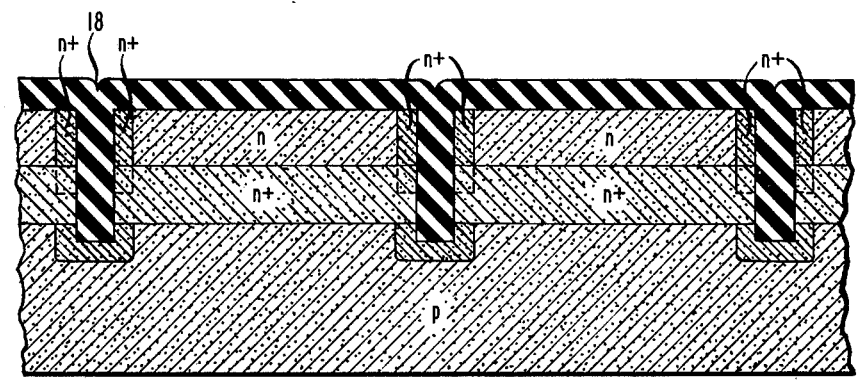

Electrical isolation can then be completed by filling the grooves with an insulating material. In accordance with one embodiment, this is done after stripping layer 14 by a thermal oxidation which forms an oxide, 18, of FIG. 5, on the surface and completely filling the grooves. An effective means for doing this would be to heat the structure in a wet oxygen ambient at a temperature in the range 1100-1250 degrees C. Where the grooves are 2 microns wide, the oxidation time will be about 7 hours to completely fill the grooves.

It will, of course, be understood that if the grooves are thermally oxidized, some semiconductor material at the sides and bottom of the grooves will be consumed. Thus, for example, if the grooves were initially 2 microns wide, they will be approximately 4 microns wide after oxidation, with 1 micron consumed from each sidewall and a small amount from the bottom surface.

The depths of diffusion of regions 16 and 17 may therefore be chosen to account for this effect. A final depth for these regions of 3 microns or less is desirable. It will be appreciated by those skilled in the art that some impurities, such as arsenic, will tend to move ahead of the growing oxide in a "snow-plow" effect. Such impurity regions will not be significantly consumed, but will convert into a region with a graded impurity concentration which may be taken into account for the final circuit processing.

It should also be realized that although thermal oxidation is clearly preferred, other methods of filling the grooves are available. For example, insulating material in the form of oxides, nitrides or polycrystalline silicon may be deposited over the surface and fill the grooves. In addition, hot pressing of glass might be employed.

Figure 6:
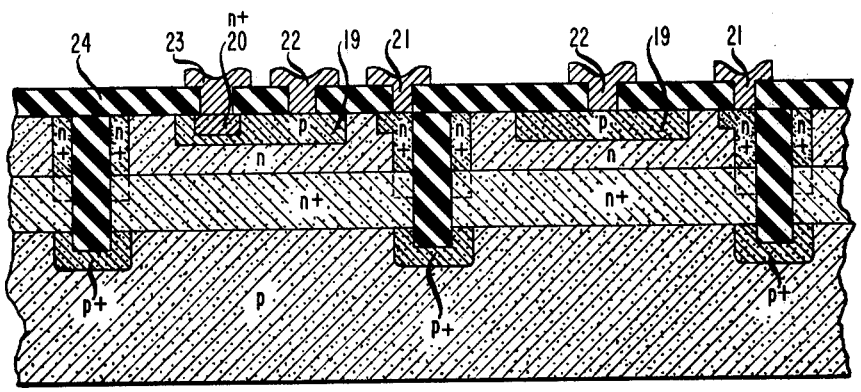

Standard integrated circuit processing can then be followed to produce the needed device structures within the isolated portions of the wafer. FIG. 6 shows a transistor in one isolated portion and a diode in the other. These structures are formed by diffusing p-type regions 19 in the n-type layer 13 and, in the case of the transistor, diffusing an n+ type region 20 into the p region. Contact to the n+ layer 12 is made through region 16 by contact metal 21 formed at the surface over insulating layer 24.

It will be noted that the n+ region has been expanded at the surface in order to allow a greater contact area. This can be done, for example, during the diffusion of the n+ emitter region. It will also be noted that a new insulating layer 24 has been formed at the surface after stripping layer 18 formed during filling of the grooves. Alternatively, the initial layer, 18, may be used throughout the processing and be part of the final device. Contact to the p regions is made by metal 22 and to the emitter by metal 23. It will be realized that these structures are illustrative only, and any of the standard integrated circuit elements can be formed within the isolated portions formed in accordance with the invention. It will also be noted that the steps involved in fabricating the device structures can be combined with those utilized to form the isolated regions. For example, the n+ regions 16 may be formed at the same time as the n+ emitter 20.

It will also be apparent that although a p-n+-n structure has been shown for the semiconductor wafer, the invention is equally applicable to an n-p+-p structure, in which case all polarities would be reversed. In addition, the wafer can comprise a p-type layer in place of the n-type layer 13 as in collector diffusion isolation structures. In such cases, the n+ layer, 12, would serve as the collector regions and the p-type layer as the base regions of the transistors. The basic processing as described above would be the same. In this regard, it will also be noted that the p-type region, 19 of FIG. 6, could be diffused over the entire surface of n layer 13 and still form isolated base regions.

Various additional modifications will become apparent to those skilled in the art. All such variations which basically rely on the teachings through which the invention has advanced the art are properly considered within the spirit and scope of the invention.

What is claimed is:

1. A method of fabricating a semiconductor structure including forming isolated regions in a semiconductor wafer (10) with major surfaces lying in the (110) plane comprising a first region (11) of a first conductivity type, a first layer (12) of opposite conductivity type formed over said region, and a second layer (13) of either conductivity type but lower concentration than the first layer formed over said first layer, the method comprising the steps of:
   etching grooves (15) in the surface of the second layer with sidewalls in the (111) plane; and
   forming a second region (16) of the same conductivity type as the first layer but higher concentration than the second layer in the sidewalls and bottom of the grooves;
   characterized in that said grooves initially extend past the boundary between the first layer and second layer and subsequent to formation of said second region the grooves are further etched and extend into the first region.

2. The method according to claim 1 further comprising the step of forming a third region (17) of the same conductivity type as the first region but higher impurity concentration in the bottom of the grooves and the portions of the sidewalls of the grooves which extend into said first region.

3. The method according to claim 1 further comprising the step of filling the grooves with an insulating material (18) subsequent to the further etching of the grooves.

4. The method according to claim 3 wherein the grooves are filled by thermal oxidation of the groove surfaces.

5. The method according to claim 1 wherein the initial width of the grooves is approximately 1-4 microns.

6. The method according to claim 2 wherein the net concentration of the second and third regions results in a final sheet resistance for the second region of 10-100 ohms per square.

7. The method according to claim 2 wherein the impurity concentration of the portion of the second region formed in the second layer lies within the range $10^{19}$-$10^{21}$ per $cm^3$ and the impurity concentration of the third region lies within the range $10^{16}$-$10^{18}$ per $cm^3$.

8. The method according to claim 4 wherein the final depth of said second region is 3 microns or less.

9. A method of fabricating a semiconductor structure including forming isolated regions in a semiconductor wafer (10) with major surfaces lying in the (110) plane comprising a substrate (11) of a first conductivity type, a first epitaxial layer (12) of opposite conductivity type formed on said substrate, and a second epitaxial layer (13) of opposite conductivity type but lower impurity concentration than the first layer formed over said first layer, the method comprising the steps of:
   etching grooves (15) in the surface of the second layer with sidewalls in the (111) plane in a parallelogram configuration bounding the isolated region;
   forming a first region (16) of the same conductivity type as the first and second layers but higher impurity concentration by diffusing impurities of said conductivity type into the sidewalls and bottom of the grooves; and
   filling the grooves with an insulating material (18) by thermal oxidation of the surfaces of the grooves;
   characterized in that said grooves initially extend into the first layer and the portion of said first region diffused in the second layer has an initial impurity concentration of $10^{19}$-$10^{21}$ per $cm^3$, subsequent to formation of said first region the grooves are further etched so they extend into the substrate, and further comprising the step of forming a second region (17) of the same conductivity type as the substrate but higher impurity concentration in the bottoms of the grooves and the portions of the sidewalls which extend into said substrate by diffusing impurities of said conductivity type into the sidewalls and bottoms of the grooves with an impurity concentration within the range $10^{16}$–$10^{18}$ per $cm^3$, and the surfaces of the groove are thermally oxidized subsequent to the formation of the first and second regions, whereby the final sheet resistance of the portion of the first region in the second layer lies within the range 10–100 ohms per square in order to provide a low resistance contact to the first layer, and the second region prevents inversion of the portions of the substrate adjacent to said grooves.

* * * * *